(12) United States Patent
Zhang et al.

(10) Patent No.: US 11,678,580 B2
(45) Date of Patent: Jun. 13, 2023

(54) METHOD FOR DEPOLARIZATION SUPPRESSION OF RHOMBOHEDRAL RELAXOR-BASED FERROELECTRIC SINGLE CRYSTALS

(71) Applicant: Harbin Engineering University, Heilongjiang (CN)

(72) Inventors: Shuangjie Zhang, Heilongjiang (CN); Piqi Song, Heilongjiang (CN)

(73) Assignee: HARBIN ENGINEERING UNIVERSITY, Heilongjiang (CN)

( * ) Notice: Subject to any disclaimer, the term of this patent is extended or adjusted under 35 U.S.C. 154(b) by 0 days.

(21) Appl. No.: 17/955,864

(22) Filed: Sep. 29, 2022

(65) Prior Publication Data

US 2023/0117560 A1    Apr. 20, 2023

(30) Foreign Application Priority Data

Oct. 14, 2021 (CN) .......................... 202111199232.0

(51) Int. Cl.
*G01N 3/08* (2006.01)

(52) U.S. Cl.
CPC ............ *H10N 30/045* (2023.02); *G01N 3/08* (2013.01); *H10N 30/8548* (2023.02); *G01N 2203/0019* (2013.01)

(58) Field of Classification Search
CPC ..... G11C 11/5657; G11C 11/221; G11B 9/02; G01R 27/2617; G02F 1/0027; H01L 29/0665; H01L 28/75; H01L 41/257; H01L 27/11507; H10N 30/045; H10N 30/8548; G01N 2203/0019; G01N 3/08
See application file for complete search history.

(56) References Cited

U.S. PATENT DOCUMENTS

| 8,241,519 B2 * | 8/2012 | Luo | H01L 41/41 |
| | | | 252/62.9 PZ |
| 2007/0267947 A1 * | 11/2007 | Matsushita | C30B 29/30 |
| | | | 29/25.35 |

OTHER PUBLICATIONS

International Search Report for CN Application 2021111992320 dated Oct. 14, 2021.
English translation of International Search Report for CN Application 2021111992320 dated Oct. 14, 2021.
(Continued)

*Primary Examiner* — Brandi N Hopkins
(74) *Attorney, Agent, or Firm* — McClure, Qualey & Rodack, LLP

(57) ABSTRACT

A method for depolarization suppression of in rhombohedral relaxor-based ferroelectric single crystal. The purpose of the present invention is to address the problem that the rhombohedral relaxor-based ferroelectric single crystals would depolarize when driven to sufficiently electric field due to their low coercive field. In the present invention, the crystal cut, poling direction and compressive stress application direction of the crystal is selected based on the domain structure and anisotropic nature of the crystal such that the spontaneous direction(s) of the crystal would rotate towards the poling direction in response to the applied compressive stress. Through application of appropriate compressive stress, the magnitude of depolarization field of the rhombohedral relaxor-based ferroelectric single crystals can be effectively increased.

2 Claims, 3 Drawing Sheets

(56) References Cited

OTHER PUBLICATIONS

Office Action for CN Application 2021111992320 dated Jun. 22, 2022.
English Transition of Office Action for CN Application 2021111992320 dated Jun. 22, 2022.
Response to Office Action for CN Application 2021111992320 dated Jun. 22, 2022.
English Translation—Response to Office Action for CN Application 2021111992320 dated Jun. 22, 2022.
Claim replacement sheets filed in connection with response in CN Application 2021111992320.
English Language translation of claim replacement sheets filed in connection with response in CN Application 2021111992320.
Notice of Allowance dated in CN Application 2021111992320.
English language translation of Notice of Allowance dated in CN Application 2021111992320.
"Control of Electrocaloric Effect in Ferroelectrics;" Jianhua Qiu; May 2015.
"Electro-optic properties of rhombohedral relaxor ferroelectric 0.93PZN-0.07PT single crystal;" Didomenico, et al.
"Recent Development on Relaxor-PbTiO3 Single Crystals the Origin of High Piezoelectric Response;" Li, et al.; Aug. 2012.

\* cited by examiner

US 11,678,580 B2

METHOD FOR DEPOLARIZATION SUPPRESSION OF RHOMBOHEDRAL RELAXOR-BASED FERROELECTRIC SINGLE CRYSTALS

TECHNICAL FIELD

The present invention relates to the technical field of piezoelectric materials, and particularly a method for depolarization suppression of rhombohedral relaxor-based ferroelectric single crystals.

BACKGROUND TECHNOLOGY

Underwater acoustic transducers are mostly driven by piezoelectric materials such as lead zirconate titanate ($PbZr_{0.52}Ti_{0.48}O_3$ or PZT) polycrystalline piezoelectric ceramics, relaxor-based ferroelectric single crystal or piezoelectric ceramic-polymer materials. As the front end of the sonar system, the underwater transducers are designed to emit and receive acoustic waves, and are widely used in fields such as vessel and submarine sonar, marine resource exploration, environment protection and medical devices. In order to detect silent underwater targets over long distance, the output power of acoustic waves generated by underwater transducers should be as high as possible.

Piezoelectric materials, which can convert electric energy to mechanical energy and vice versa, serve as the core component of an underwater transducer. Compared with conventional lead zirconate titanate ($PbZr_{0.52}Ti_{0.48}O_3$ or PZT) polycrystalline piezoelectric ceramics, lead-based relaxor-PT ferroelectric single crystals of rhombohedral phase exhibit superior piezoelectric properties and mechanical deformation capability, and thus enable transducer design of broader bandwidth and higher efficiency and response.

To obtain maximum output power, the transducers are mostly driven by an AC electric field and radiate acoustic waves into the medium under resonance mode. The magnitude of the acoustic vibration depends on the piezoelectric effects, mechanical quality factor and the driving electric field. The maximum allowable positive and negative driving fields of the transducer are limited by the magnitude of phase transition field and depolarization field of the crystals, respectively, in order to maintain the crystals in optimally poled rhombohedral phase and ensure the transducer's stable operation. However, due to their low coercive field, single crystals would depolarize when driven to sufficiently high electric field, and the electric stability of the transducer would be seriously affected.

SUMMARY OF THE INVENTION

A purpose of the present invention is to address the technical problem that the rhombohedral relaxor-based ferroelectric single crystals would depolarize when driven to sufficiently high electric field due to their low coercive field, and to provide a method for depolarization suppression of rhombohedral relaxor-based ferroelectric single crystals.

The method for depolarization suppression of rhombohedral relaxor-based ferroelectric single crystals comprising:

Step 1: Select the crystal cut, polarization direction and the application direction of compressive stress according to the domain structures and anisotropic nature of the rhombohedral relaxor-based ferroelectric single crystals, such that the spontaneous polarization direction(s) of the rhombohedral relaxor-based ferroelectric single crystals would rotate towards the poling direction under the application of the compressive stress;

Step 2: Apply the compressive stress onto the single crystals along the direction determined in step 1, apply a negative electric field opposite to the poling direction of the single crystal using a DC power supply, measure the strain of the single crystals at different driving electric field, plot the electric field-strain curve and obtain the depolarization field of the crystals under compressive stress;

Step 3: Repeat step 2 for times and obtain the depolarization field of the crystals under different compressive stress, and note that prior to repeat step 2, the rhombohedral relaxor-based ferroelectric single crystals should be re-poled, a compressive stress-depolarization field curve of the rhombohedral relaxor-based ferroelectric single crystals can be finally obtained; and Step 4: Determine the direction and magnitude of the compressive stress required for depolarization suppression of the single crystals during actual application based on the application direction of the compressive stress obtained in step 1, and the compressive stress-depolarization field curve obtained in the step 3. The applied compressive stress should be no less than the compressive stress indicated in the compressive stress-depolarization field curve obtained in the step 3 at the corresponding driving electric field.

Further, the rhombohedral relaxor-based ferroelectric single crystals comprise cuts of binary, ternary or higher-order solid solutions of one or more elements of the rhombohedral relaxor-based ferroelectric single crystals.

Further, the rhombohedral relaxor-based ferroelectric single crystals comprise one or more of $Pb(Zn_{1/3}Nb_{2/3})O_3$, $Pb(Mg_{1/3}Nb_{2/3})O_3$, $Pb(In_{1/2}Nb_{1/2})O_3$, $Pb(Fe_{1/2}Nb_{1/2})O_3$, $Pb(Yb_{1/2}Nb_{1/2})O_3$, $Pb(Lu_{1/2}Nb_{1/2})O_3$, $Pb(Mn_{1/2}Nb_{1/2})O_3$, $PbZrO_3$ and $PbTiO_3$ and their modified and/or doped derivative thereof.

Further, in the step 1, the rhombohedral relaxor-based ferroelectric single crystals comprise $[011]_3$ poled single crystal of $[0-11] \times [100]_2 \times [011]_3$ cut, wherein $[011]_3$ is the longitudinal direction, and $[0-11]_1$ and $[100]_2$ are two transverse directions.

Further, in the step 1, the application direction of the compressive stress on the rhombohedral relaxor-based ferroelectric single crystals is in the $[100]_2$ direction.

Further, in the step 1, the rhombohedral relaxor-based ferroelectric single crystals comprise $[001]_3$ poled single crystal of $[100]_1 \times [010]_2 \times [001]_3$ cut, wherein $[001]_3$ is the longitudinal direction, and $[100]_1$ and $[010]_2$ are two transverse directions.

Further, in the step 1, the application direction of the compressive stress on the rhombohedral relaxor-based ferroelectric single crystals is in the $[100]_2$ or $[010]_2$ direction.

Still further, in the step 1, the rhombohedral relaxor-based ferroelectric single crystals comprise $[001]_3$ poled single crystal of $[110]_1 \times [1-10]_2 \times [001]_3$ cut, wherein $[001]_3$ is the longitudinal direction and $[100]_1$ and $[1-10]_2$ are two transverse directions.

Further, in the step 1, the application direction of the compressive stress is in the $[100]_1$ or $[1-10]_2$ direction.

Further, in the step 2, the compressive stress is applied by dead weights, or by springs and pre-stress bolts and nuts, or by pre-stressed reinforcing ribs or by tensile membranes.

Further, in the step 2, the methods to measure strain of the single crystals under different electric fields comprise contact methods or contactless methods, wherein strain gauges, dial gauges or linear variable differential transformers are utilized for the contact methods and laser Doppler vibrometers is used for the contactless methods.

Significant effects of the present invention compared with the prior art:

1) In the present invention, by adjusting the compressive stress applied to the relaxor-based ferroelectric single crystal, the depolarization of single crystals can be controlled and suppressed. The present invention can effectively increase the magnitude of depolarization field, overcome the disadvantages of low coercive field and depolarization field the relaxor-based ferroelectric single crystals, and improve the maximum source level and output power of underwater acoustic projectors driven by such crystals.

2) With the method disclosed in the present invention, neither complex direct current bias device nor additional electric component is required, which not only reduces the complexity of the entire sonar system, but also effectively improves the driving electric field, and hence the maximum source level and output power of underwater acoustic projectors driven by rhombohedral relaxor-based ferroelectric single crystals.

EMBODIMENTS

To better explain the purposes and advantages of the present invention, hereafter a detailed description will be given to the present invention in conjunction with accompanying drawings.

Figure 1:
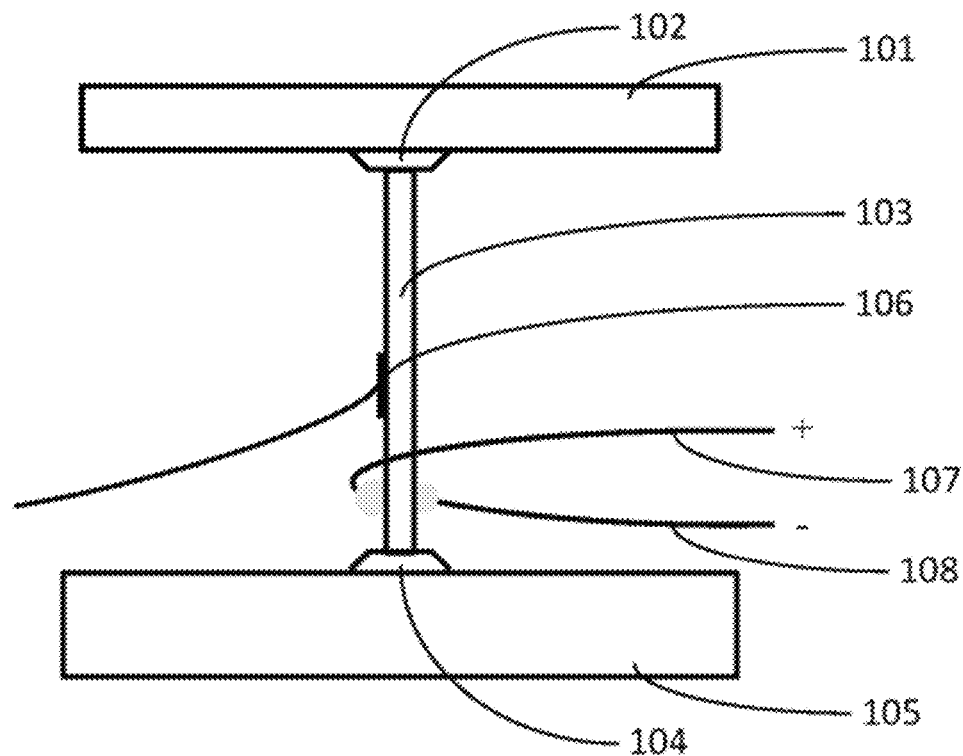
FIG. 1 is a diagram showing the experiment device: wherein 101 is an upper load plate of the experiment device, 102 is a crystal positioning fixture, 103 is the relaxor-based ferroelectric single crystal, 104 is another crystal positioning fixture, 105 is the base plate of the experiment device, 106 is a strain gauge, 107 is a conducting wire connecting the positive surface of the crystal and 108 is a conducting wire connecting the negative surface of the crystal.

In FIG. 1 an experiment device for applying compressive stress on the relaxor-based ferroelectric single crystals is disclosed. The experiment device comprises an upper load plate, a base plate and crystal positioning fixtures. By applying compressive stress evenly through the upper load plate and measuring the strain of the relaxor-based ferroelectric single crystal, the depolarization field under the compressive stress can be obtained.

Figure 2:
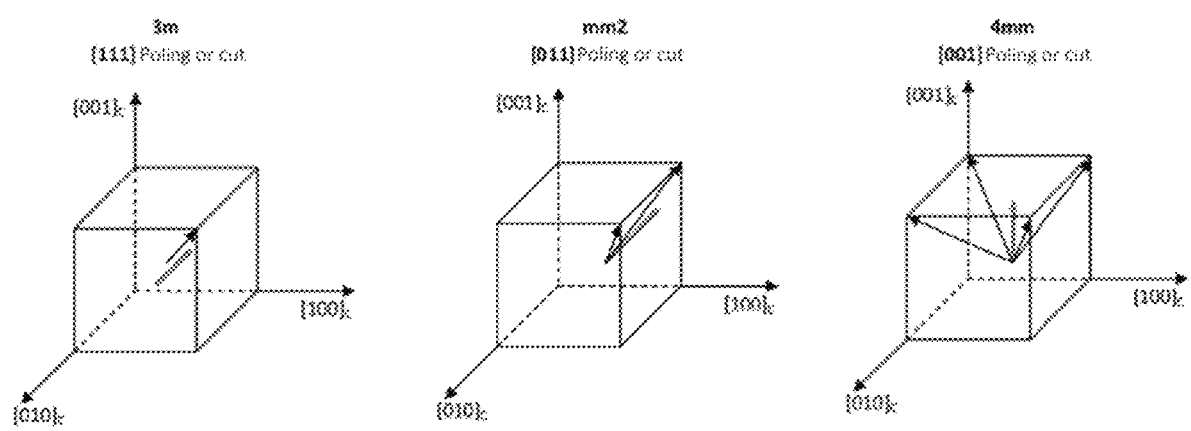
FIG. 2 are diagrams showing the phase structure, the poling direction and the domain structure of the rhombohedral relaxor-based ferroelectric single crystals in the present invention.

FIG. 2 shows the poling direction and the domain structure of the rhombohedral relaxor-based ferroelectric single crystals. The symmetry of lattices of the relaxor-based ferroelectric single crystal depends on the phase structure thereof, and is independent of polarization. However, when poled along different directions, the electric domain structures formed in the relaxor-based ferroelectric single crystal would be different; therefore, the macroscopic symmetry thereof is closely related to the poling direction of the crystal. For the relaxor-based ferroelectric single crystals of the three typical cuts, the macroscopic symmetry thereof depends on the poling direction, as shown in FIG. 1. The macroscopic symmetry of the crystal poled along the spontaneous polarization direction is the same as the microscopic symmetry thereof, and the macroscopic physical performance of the crystal reflects the properties of single domain of the crystal. When poled along a nonpolar axis, the crystal is in multidomain state, and at this time the macroscopic symmetry is dependent on the poling direction.

Figure 3:
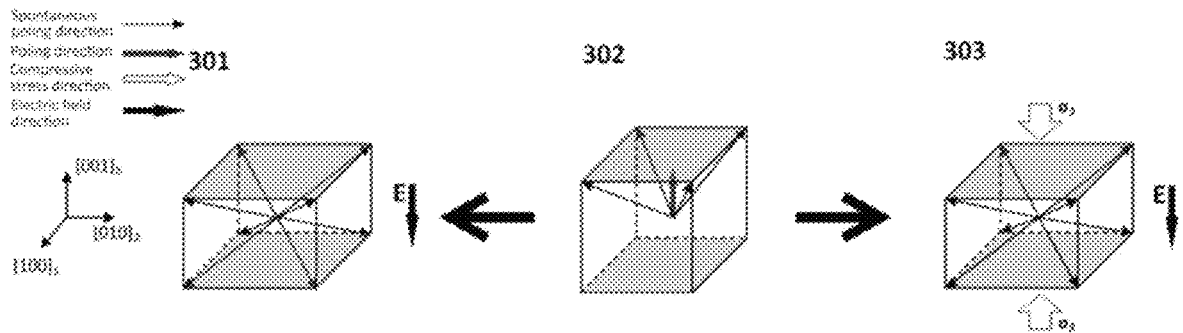
FIG. 3 are diagrams showing the influence of the compressive stress in the $[001]_3$ direction and the negative electric field in $[001]_3$ direction on $[001]_3$ poled rhombohedral relaxor-based ferroelectric single crystals; wherein 301 denotes depolarization due to the negative electric field, 302 shows the electric field free and stress free state, 303 denotes depolarization caused by the combined effect of the compressive stress and the negative electric field.
Figure 4:
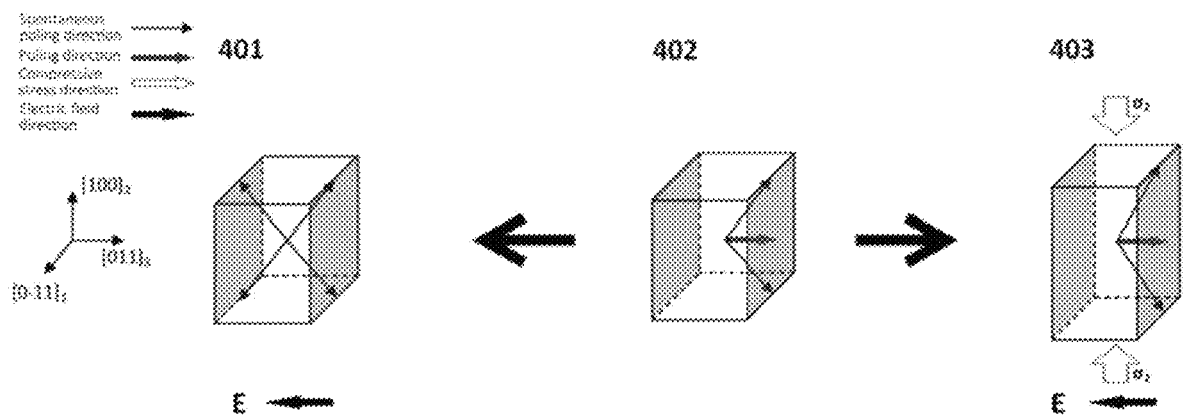
FIG. 4 are diagrams showing the influence of the compressive stress in the $[100]_2$ direction and the negative electric field in the $[011]_3$ direction on the rhombohedral relaxor-based ferroelectric single crystals poled along $[011]_3$ direction; wherein 401 denotes depolarization due to the negative electric field, 402 denotes the electric field free and stress free state, and 403 denotes depolarization suppression due to the application of compressive stress.
Figure 5:
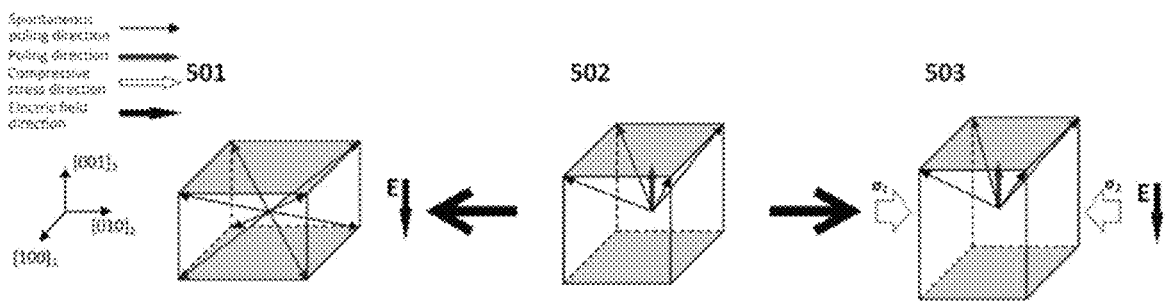
FIG. 5 are diagrams showing the influence of the compressive stress in the $[010]_2$ direction and the negative electric field in the $[001]_3$ direction on the $[001]_3$ poled rhombohedral relaxor-based ferroelectric single crystals; wherein 501 denotes depolarization due to the negative electric field, 502 denotes the electric field free and stress free state, and 503 shows depolarization suppression due to the application of compressive stress.
Figure 6:
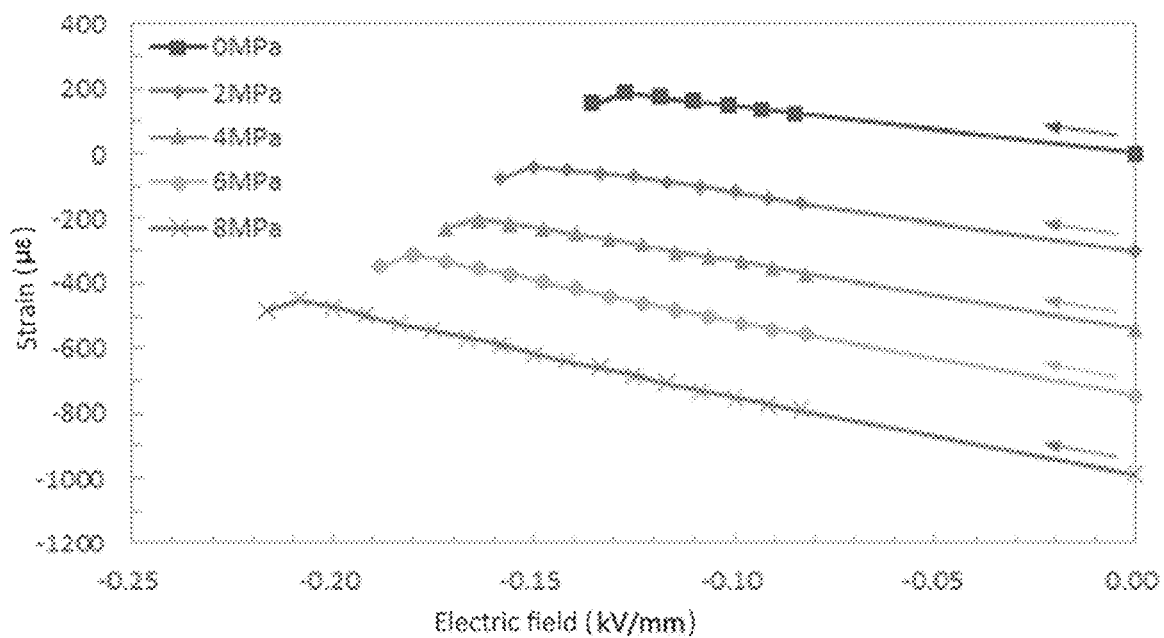
FIG. 6 is an electric field-strain plot of the $[011]_3$ poled PZN-5.5% PT rhombohedral relaxor-based ferroelectric single crystals.
Figure 7:
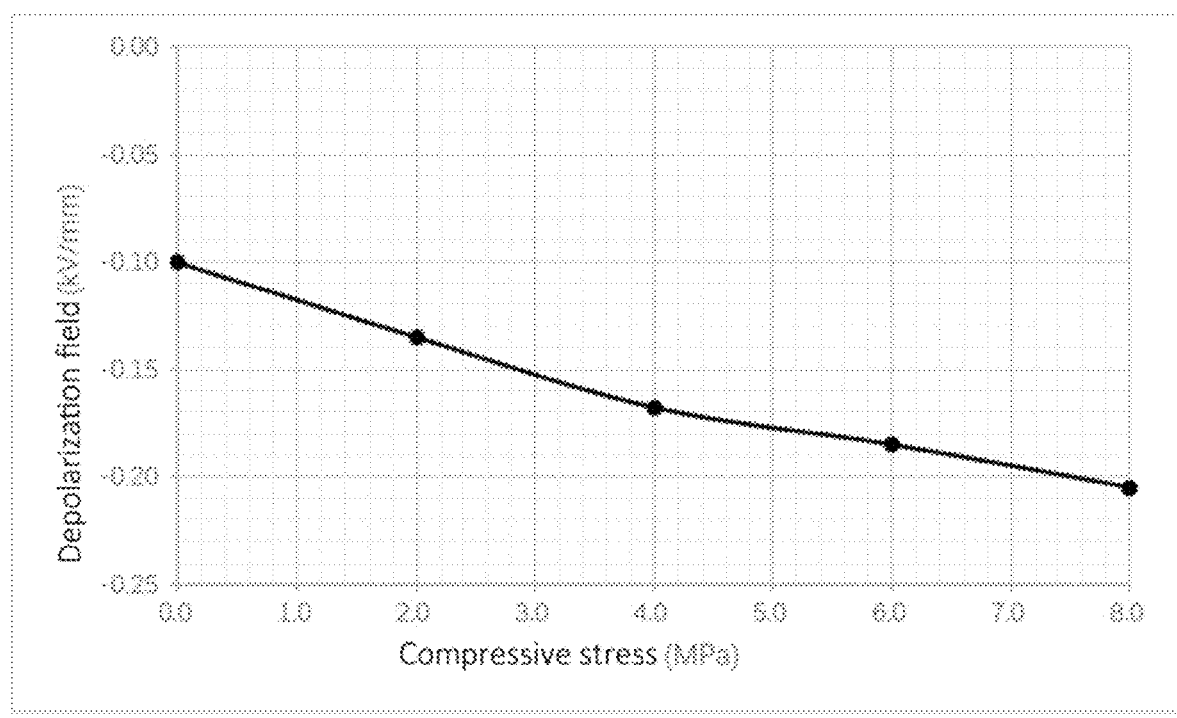
FIG. 7 is a compressive stress-depolarization field curve of the $[011]_3$ poled PZN-5.5% PT rhombohedral relaxor-based ferroelectric single crystals.

Embodiment 1: a method for depolarization suppression of the PZN-5.5% PT rhombohedral relaxor-based ferroelectric single crystals comprising:

Step 1: Select the crystal cut, polarization direction and the application direction of compressive stress according to domain structure and anisotropic nature of the rhombohedral relaxor-based ferroelectric single crystals, such that the spontaneous polarization direction(s) of the rhombohedral relaxor-based ferroelectric single crystals would rotate towards the poling direction under the application of the compressive stress (as shown in FIGS. 3-5);

Step 2: Apply compressive stress onto the single crystal along the direction determined in step 1, apply a negative electric field opposite to the poling direction of the single crystal using a DC power supply, measure the strain of the single crystals at different driving electric field, plot the electric field-strain curve and obtain the depolarization field of the crystals under compressive stress; wherein the compressive stress is applied via dead weights; and one approach to measure the strain of the crystals under different electric field is to use a strain gauge and a strain gauge meter;

Step 3: Repeat step 2 for times and obtain the depolarization field of the crystals under different compressive stress. Note that prior to repeat step 2, the rhombohedral relaxor-based ferroelectric single crystal should be re-poled, a compressive stress-depolarization field curve of the rhombohedral relaxor-based ferroelectric single crystal can be finally obtained (as shown in FIGS. 6 and 7);

Step 4: Determine the direction and magnitude of the compressive stress required for depolarization suppression of the single crystals during actual application based on the application direction of the compressive stress obtained in step 1, and the compressive stress-depolarization field curve obtained in the step 3. The applied compressive stress should be no less than the compressive stress indicated in the compressive stress-depolarization field curve obtained in the step 3 at the corresponding driving electric field.

The rhombohedral relaxor-based ferroelectric single crystals poled along $[001]_3$ direction exhibit superior longitudinal piezoelectric properties, $[001]_3$ poled single crystal of $[100]_1 \times [010]_2 \times [001]_3$ cut included, wherein $[001]_1$ denotes the longitudinal direction, and $[100]_1$ and $[010]_2$ denote two lateral or transverse directions. However, excessively high compressive stress and/or negative electric field can result in rhombohedral-to-tetragonal phase transformation, as shown in FIG. 3, therefore, appropriate direct current bias is required to increase the stability of the crystals under high electric field and high strain conditions.

The $[011]_3$ poled rhombohedral relaxor-based ferroelectric single crystals exhibit excellent transverse piezoelectric properties along $[100]_2$ directions. The application of compressive stress along $[100]_2$ direction would promote the spontaneous polarization directions to rotate towards the poling direction. The negative drive electric field would have to first overcome the compressive stress and then can cause depolarization as shown in FIG. 4. Thus by applying the compressive stress in the $[100]_2$ direction, the depolarization field of the relaxor-based ferroelectric single crystals poled along $[011]_3$ can be increased, the problem of low coercive field and depolarization field of the relaxor-based ferroelectric single crystals can be overcome, and the maximum source level and output power of the underwater projectors can be effectively improved.

As shown in FIG. 5, for rhombohedral relaxor-based ferroelectric single crystals poled along $[001]_3$ direction, the compressive stress applied along $[010]_2$ direction would cause the spontaneous polarization directions to rotate towards the poling direction and generate positive strain in the $[001]_3$ direction. Therefore, by applying compressive stress in the $[010]_2$ direction or its equivalent $[100]_1$ direction, the depolarization field of the $[001]_3$ poled relaxor-based ferroelectric single crystals can be increased and the maximum source level and output power of the underwater projectors can be effectively improved.

What is claimed is:

1. A method for depolarization suppression of rhombohedral relaxor-based ferroelectric single crystals comprising:

step 1: selecting crystal cut, poling direction and application direction of compressive stress according to domain structures and anisotropic nature of the rhombohedral relaxor-based ferroelectric single crystals, such that spontaneous polarization direction(s) of the relaxor-based ferroelectric single crystals would rotate towards the poling direction under the application of the compressive stress;

wherein the rhombohedral relaxor-based ferroelectric single crystals comprise one or more of $Pb(Zn_{1/3}Nb_{2/3})O_3$, $Pb(Mg_{1/3}Nb_{2/3})O_3$, $Pb(In_{1/2}Nb_{1/2})O_3$, $Pb(Fe_{1/2}Nb_{1/2})O_3$, $Pb(Yb_{1/2}Nb_{1/2})O_3$, $Pb(Lu_{1/2}Nb_{1/2})O_3$, $Pb(Mn_{1/2}Nb_{1/2})O_3$, $PbZrO_3$ and $PbTiO_3$ and modified and/or doped derivative thereof;

wherein in the step 1, the rhombohedral relaxor-based ferroelectric single crystals comprise $[011]_3$ poled single crystal of $[0-11]_1 \times [100]_2 \times [011]_3$ cut, wherein $[011]_3$ is a longitudinal direction, and $[0-11]_1$ and $[100]_2$ are two transverse directions; wherein the application direction of the compressive stress is in the $[100]_2$ direction;

wherein in the step 1, the rhombohedral relaxor-based ferroelectric single crystals comprise $[001]_3$ poled single crystal of $[110]_1 \times [1-10]_2 \times [001]_3$ cut, wherein $[001]_3$ is a longitudinal direction and $[100]_1$ and $[1-10]_2$ are two transverse directions; wherein the application direction of the compressive stress is in the $[100]_1$ or $[1-10]_2$ direction;

wherein in the step 1, the rhombohedral relaxor-based ferroelectric single crystals comprise $[001]_3$ poled single crystal of $[100]_1 \times [010]_2 \times [001]_3$ cut, wherein $[001]_3$ is a longitudinal direction, and $[100]_1$ and $[010]_2$ are two transverse directions; wherein the application direction of the compressive stress is in the $[100]_2$ or $[010]_2$ direction;

step 2: applying the compressive stress onto the single crystals along the application direction determined in step 1, apply a negative electric field opposite to the poling direction of the single crystals using a DC power supply, measure strain of the single crystals at different driving electric field, plot an electric field-strain curve and obtain depolarization field of the single crystals under the compressive stress;

step 3: repeating step 2 for times and obtain the depolarization field of the single crystals under application of different compressive stress, and note that prior to repeat step 2, re-pole the rhombohedral relaxor-based ferroelectric single crystal, a compressive stress-depolarization field curve of the rhombohedral relaxor-based ferroelectric single crystal is finally obtained; and step 4: determining direction and magnitude of the compressive stress required for depolarization suppression of the single crystals during actual application based on the application direction of the compressive stress obtained in step 1 and the compressive stress-depolarization field curve obtained in the step 3; the applied compressive stress should be no less than the compressive stress indicated in the compressive stress-depolarization field curve obtained in the step 3 at the corresponding driving electric field.

2. The method for depolarization suppression of rhombohedral relaxor-based ferroelectric single crystals according to claim 1, wherein in the step 2, the compressive stress is applied by dead weights, or by springs and pre-stress bolts, or by pre-stressed reinforcing ribs or by tensile membranes; in the step 2, the methods to measure the strain of the single crystals under different electric field comprises contact methods or contactless methods, wherein strain gauges, dial gauges or linear variable differential transformers are utilized for the contact methods and laser Doppler vibrometers are used for the contactless methods.

* * * * *